(12) United States Patent
Franzon et al.

(10) Patent No.: US 8,982,598 B2
(45) Date of Patent: Mar. 17, 2015

(54) STACKED MEMORY DEVICE WITH REDUNDANT RESOURCES TO CORRECT DEFECTS

(71) Applicant: Rambus Inc., Sunnyvale, CA (US)

(72) Inventors: Paul Damian Franzon, New Hill, NC (US); Evan Lawrence Erickson, Chapel Hill, NC (US); Thomas Vogelsang, Mountain View, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/865,110

(22) Filed: Apr. 17, 2013

(65) Prior Publication Data

US 2013/0279280 A1    Oct. 24, 2013

Related U.S. Application Data (60) Provisional application No. 61/635,250, filed on Apr. 18, 2012.

(51) Int. Cl.
*G11C 5/02* (2006.01)
*G11C 29/04* (2006.01)
*G11C 29/00* (2006.01)

(52) U.S. Cl.
CPC .............. *G11C 29/04* (2013.01); *G11C 29/702* (2013.01); *G11C 29/808* (2013.01)
USPC .......... 365/51; 365/185.11; 365/63; 365/132; 365/230.01

(58) Field of Classification Search
CPC ........ G11C 5/02; G11C 5/06; G11C 29/4401; G11C 29/785; G11C 2213/71; G11C 29/26; H01L 27/0688; H01L 27/11551
USPC .................... 365/185.11, 51, 63, 132, 230.01
See application file for complete search history.

(56) References Cited

U.S. PATENT DOCUMENTS 5,940,852 A    8/1999    Rangasayee et al.
6,049,223 A    4/2000    Lytle et al.
(Continued)

FOREIGN PATENT DOCUMENTS

JP    06-250935 A    9/1994
JP    2008-084052 A    4/2008
(Continued)

OTHER PUBLICATIONS

Anigundi, R; et al., "Architecture design exploration of three-dimensional (3D) integrated DRAM," Quality of Electronic Design, 2009. ISQED 2009, pp. 86-90, Mar. 16-18, 2009. 5 pages.
(Continued)

*Primary Examiner* — Fernando Hidalgo
(74) *Attorney, Agent, or Firm* — Stolowitz Ford Cowger LLP (57) ABSTRACT

A memory device includes a stack of circuit layers, each circuit layer having formed thereon a memory circuit configured to store data and a redundant resources circuit configured to provide redundant circuitry to correct defective circuitry on at least one memory circuit formed on at least one layer in the stack. The redundant resources circuit includes a partial bank of redundant memory cells, wherein an aggregation of the partial bank of redundant memory cells in each of the circuit layers of the stack includes at least one full bank of redundant memory cells and wherein the redundant resources circuit is configured to replace at least one defective bank of memory cells formed on any of the circuit layers in the stack with at least a portion of the partial bank of redundant memory cells formed on any of the circuit layers in the stack.

48 Claims, 10 Drawing Sheets (56) References Cited

U.S. PATENT DOCUMENTS

| | | | |
|---|---|---|---|
| 7,219,275 | B2 | 5/2007 | Chang et al. |
| 7,443,756 | B2 | 10/2008 | Lee et al. |
| 7,863,733 | B2 | 1/2011 | Flautner et al. |
| 7,936,622 | B2 | 5/2011 | Li et al. |
| 2005/0157579 | A1 | 7/2005 | Perego et al. |
| 2009/0213645 | A1 | 8/2009 | Parkinson et al. |
| 2010/0172197 | A1* | 7/2010 | Leedy ............... 365/200 |
| 2011/0002152 | A1 | 1/2011 | Lane et al. |
| 2011/0007588 | A1* | 1/2011 | Li et al. ............. 365/200 |
| 2011/0080185 | A1 | 4/2011 | Wu et al. |
| 2011/0084722 | A1 | 4/2011 | Nishioka |
| 2011/0125982 | A1 | 5/2011 | Choi et al. |
| 2011/0175639 | A1 | 7/2011 | Yoko et al. |
| 2012/0166753 | A1 | 6/2012 | Vogelsang |
| 2013/0021861 | A1* | 1/2013 | Shvydun et al. ..... 365/200 |

FOREIGN PATENT DOCUMENTS

| | | |
|---|---|---|
| JP | 2008-112503 A | 5/2008 |
| WO | WO-2011-049710 | 4/2011 |
| WO | WO-2011-115648 | 9/2011 |
| WO | WO-2013/033628 A1 | 3/2013 |

OTHER PUBLICATIONS

International Search Report and Written Opinion dated Nov. 9, 2012 in International Application No. PCT/US2012/053516. 10 pages.

Jiang, Li et al., "Yield enhancement for 3D-stacked memory by redundancy sharing across dies," 2010 IEEE/ACM International Conference on Computer-Aided Design (ICCAD), pp. 230-234, Nov. 7-11, 2010. 5 pages.

* cited by examiner

STACKED MEMORY DEVICE WITH REDUNDANT RESOURCES TO CORRECT DEFECTS

RELATED APPLICATIONS

This application claims priority to U.S. provisional patent application No. 61/635,250, filed Apr. 18, 2012, all of which is incorporated herein in its entirety.

COPYRIGHT NOTICE

© 2012 Rambus, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all rights whatsoever available under 37 CFR §1.71(d).

TECHNICAL FIELD

We disclose a three-dimensional integrated circuit and, more particularly, a stacked memory device including a plurality of semiconductor circuit layers, each of which has formed thereon a redundant resources circuit configured to correct defective circuitry on at least one of the plurality of semiconductor circuit layers.

BACKGROUND

A stacked memory device is a three-dimensional integrated circuit produced by stacking two or more semiconductor circuit layers having electronic components formed thereon. The stack may comprise two or more wafers stacked one on top of another (wafer-on-wafer), a die stacked on top of a wafer (die-on-wafer), or two die stacked one on top of the other (die-on-die). The electronic components built on each of the semiconductor layers may be vertically electrically integrated or coupled to one another using through-silicon vias (TSVs) that pass through the semiconductor circuit layers.

The technology to manufacture a three-dimensional integrated circuit such as a stacked memory device is continuously developing and improving, but challenges still exist including yield risks, heat buildup, design complexity, TSV overhead, testing, or the like.

DETAILED DESCRIPTION

Figure 1A:
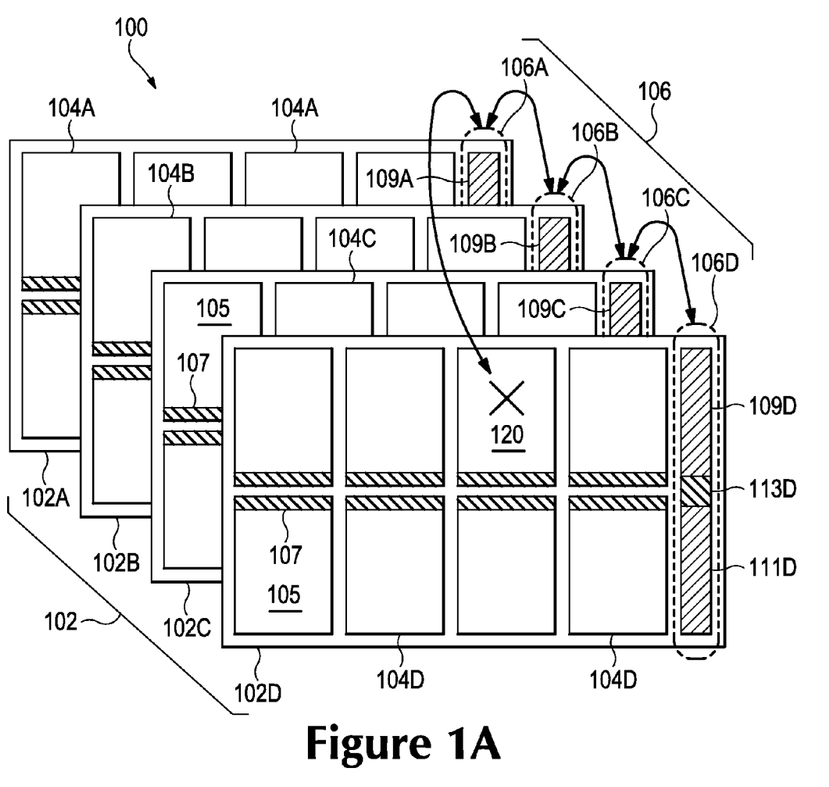
FIGS. 1A and 1B are illustrations of a stacked memory device according to various embodiments.
Figure 1B:
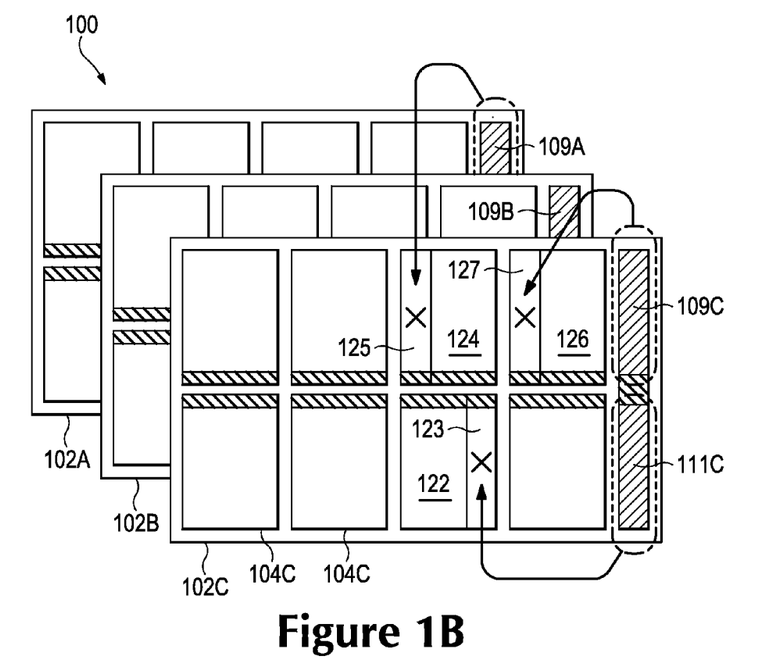

FIGS. 1A and 1B are illustrations of a stacked memory device according to various embodiments. Referring to FIGS. 1A and 1B, exemplary stacked memory device 100 includes semiconductor circuit layers 102A, 102B, 102C, and 102D, each of which has integrated circuits formed thereon. Each of semiconductor circuit layers 102A, 102B, 102C, and 102D may be made of any circuit structure known to a person of ordinary skill in the art. Each of semiconductor circuit layers 102A, 102B, 102C, or 102D are generally a single die taken from a wafer containing a large number of die. A wafer may be made of a thin slice of semiconductor material, such as a silicon crystal, or an insulator having silicon thereon, used in the fabrication of integrated circuits. The wafer serves as a substrate upon which integrated circuits are built using well-known manufacturing processes including doping or ion implantation, etching, deposition, photolithographic patterning, or the like.

Semiconductor circuit layers 102A, 102B, 102C, and 102D are stacked and electrically connected in one embodiment using, e.g., through silicon vias (TSVs) to pass signals and power through the stack. Stacking may be accomplished while the layers are still at the wafer stage (wafer-on-wafer stacking), e.g., a set of wafers may be stacked, aligned, and bonded one on top of another using well-known semiconductor manufacturing processes, with the structure shown in FIG. 1A cut from the wafer stack as a unit. Alternatively, semiconductor circuit layers 102A, 102B, 102C, and 102D may correspond to wafers as before but with some wafers having been cut down to dies, which are stacked on a wafer (die-on-wafer stacking). As a third alternative, individual die may be stacked, aligned, and bonded to form the structure of FIG. 1A.

In an alternative embodiment, the circuit layers are arranged on a common substrate that has supporting circuitry, with each circuit layer comprising memory cells and access lines.

Each of semiconductor circuit layers 102A, 102B, 102C, or 102D respectively includes at least one corresponding memory circuit 104A, 104B, 104C, and 104D and a corresponding redundant resources circuit 106A, 106B, 106C, and 106D (collectively, combined redundant resources circuit 106). Each memory circuit 104A, 104B, 104C, or 104D, in turn, includes a memory bank (e.g., memory bank 105) and is associated with an input/output field (e.g., input output field 107).

Memory bank 105 may include memory cells of any kind known to a person of ordinary skill in the art including dynamic random access memory (DRAM), flash memory, read only memory (ROM), ferroelectric RAM, resistive RAM, and the like and each cell may have the capability to store one or more bits of information. Memory bank 105 may be organized as an R row by C column memory cell array, where R and C are greater than 1. Although referred to herein as a "bank" for convenience, the memory cell array may be, e.g., a bank in an externally addressable bank structure, a sub-bank thereof, or another internally addressable sub-partition of a larger memory structure. The memory cell array may include, e.g., spare rows and/or columns for potential repair of faulty rows and/or columns in that memory cell array.

Input/output field 107 may be configured to multiplex memory circuits formed on one semiconductor layer with other memory circuits formed on a same circuit layer to a common I/O path, e.g., memory circuit 104D formed on circuit layer 102D and other memory circuits 104D also formed on circuit layer 102D. Input/output field 107 may be configured to vertically multiplex memory circuits formed on a circuit layer with memory circuits formed on other circuit layers in the stacked memory device 100, e.g., input/output field 107 may multiplex memory circuits 104A on circuit layer 102A, memory circuits 104D on circuit layer 102D, and memory circuits 104B on circuit layer 102B to a common I/O path.

In an embodiment of stacked memory device 100, each of redundant resources circuits 106A, 106B, 106C, or 106D includes a partial bank of memory cells, e.g., 109D or 111D, formed on each of the semiconductor layers 102A, 102B, 102C, and 102D. For simplicity, the description we provide below applies to partial banks 109A, 109B, 109C, 109D, 111D (and 111A, 111B, and 111C, not visible but corresponding to 111D) even though the description refers representatively to partial banks 109D or 111D.

Partial banks 109D and 111D may be sized to be smaller than or a portion of a size of memory bank 105 formed on semiconductor circuit layer 102D. The combination of partial banks 109A, 109B, 109C, 109D, 111A, 111B, 111C, and 111D, however, may be sized to be equal to or greater than the size of memory bank 105. Partial bank 109D may be sized, e.g., to be 1/64, 1/32, 1/16, 1/8, 1/4, or 1/2 of the size of memory bank 105. Similarly, partial bank 111D may be sized, e.g., to be 1/64, 1/32, 1/16, 1/8, 1/4, or 1/2 of the size of memory bank 105.

Collectively, a combination of partial banks 109A, 109B, 109C, 109D, 111A, 111B, 111C, and 111D and I/O fields 113A, 113B, 113C, and 113D form redundant resources circuit 106, which may be configured to repair a defective memory bank 105 formed on any of semiconductor circuit layers 102A, 102B, 102C, or 102D. A defective memory bank is generally a bank that contains a combination of faults that cannot be repaired through conventional in-bank redundant row/column repair procedures.

In an embodiment of stacked memory device 100, each of redundant resources circuits 106A, 106B, 106C, or 106D includes a corresponding I/O field, e.g., I/O fields 113A, 113B, 113C, and 113D, respectively, configured to address and generally provide input and output capability to partial banks 109A, 109B, 109C, 109D, 111A, 111B, 111C, and 111D, or a combination thereof. I/O fields 113A, 113B, 113C, and 113D may be electrically vertically coupled using TSVs formed on semiconductor circuit layers 102A, 102B, 102C, or 102D. In an embodiment, each of I/O fields 113A, 113B, 113C, and 113D may include a self-addressing scheme based on an order in the stack of memory device 100. In yet another embodiment, a separate integrated circuit (not shown) included in the stack of memory devices 100 may be configured to provide the necessary routing of input and output lines for replacing defective memory circuit 120 with at least portions of the redundant resources circuits 106A, 106B, 106C, or 106D.

As is well known, an integrated circuit is tested during various stages of production, e.g., wafer testing, device testing, and the like. During wafer testing, specialized test equipment, e.g., a prober, may functionally test individual integrated circuits formed on the wafer by applying special test patterns using probes. If a predetermined number of individual integrated circuits on the wafer fail the test, the wafer is considered faulty and may not be further processed to avoid additional manufacturing costs. An integrated circuit is likely to be tested again as a die, i.e., after it is cut from the wafer, or as a packaged device.

Memory circuits 104A, 104B, 104C, or 104D, and possibly redundant resources circuits 106A, 106B, 106C, or 106D, formed on each of semiconductor circuit layers 102A, 102B, 102C, or 102D, respectively, may be tested to identify known good die (KGD) before dicing or stacking. Testing to KGD is a relatively expensive process since pre- and post-stacking tests are necessary. Alternatively, stacked memory device 100 including memory circuits 104A, 104B, 104C, or 104D and redundant resources circuits 106A, 106B, 106C, or 106D may be tested after stacking, replacing circuits in the stack that are determined defective or faulty. Doing so may lead to significant reduction in production costs.

In an embodiment shown in FIG. 1A, a memory bank 120 formed on semiconductor layer 102D is determined defective during testing using any number of known integrated circuit tests. Redundant resources circuit 106, which is distributed across circuit layers 102A, 102B, 102C, and 102D, may be configured to replace defective memory bank 120. In an embodiment, each of the partial banks 109A, 109B, 109C, 109D, 111A, 111B, 111C, and 111D is 1/8 the size of memory bank 105 or defective memory bank 120 such that their combination results in a full bank being available to replace defective memory bank 120.

In an embodiment shown in FIG. 1B, portion 123 of memory bank 122 and portion 127 of memory bank 126 formed on semiconductor layer 102C may be determined defective during testing. Partial memory banks 111C and 109C formed on semiconductor circuit layer 102C may be configured to replace the defective portions 123 and 127, respectively. Similarly, portion 125 of memory bank 124 formed on semiconductor layer 102C may be determined defective during testing and replaced with partial memory bank 109A formed on semiconductor circuit layer 102A. Put differently, any defective portion of a memory bank, e.g., portions 123, 125, or 127, formed on any semiconductor circuit layer, e.g., layer 102C, may be replaced with any partial memory bank, e.g., 111C, 109A, or 109C, formed on any semiconductor circuit layer, e.g., layers 102C or 102A.

FIGS. 2A to 2G are illustrations of circuit arrangements in a semiconductor layer in a stacked memory device according to various embodiments. Semiconductor layer 202A includes multiple memory circuits, including a memory circuit 204A and a redundant resources circuit 206A. Each memory circuit 204A, in turn, includes a memory bank 205 and is associated with an I/O field 207. Redundant resources circuit 206A includes partial memory banks 209A and 211A and an I/O field 213A. In an embodiment shown in FIG. 2A, redundant memory circuit 206A is organized column-wise (each partial memory bank contains a number of rows corresponding to the memory circuit that will be replaced, but less columns) and is arranged at a left or right end (on a plan view, assuming the bank rows are horizontal in the figure) of memory circuits 204A. Each partial memory bank 209A or 211A thus includes an array of memory cells 212 with a full row decoder 210 and a partial column decoder 208. In the embodiment shown in FIG. 2A, if memory bank 205 includes R addressable rows by C addressable columns, each partial memory bank 209A or 211A may include R addressable rows and $C/2^N$ addressable columns (plus optional spare columns and/or rows for column and/or row repair to replace defective addressable columns and/or rows), where N is an integer. A decoder, e.g., logic 350 shown in FIG. 3A, selects a correct one of the redundant resources circuits 206A arranged on one of the circuit layers for the column address, based on the portion of the column address not decoded by the partial column decoder 208.

Figure 2A:
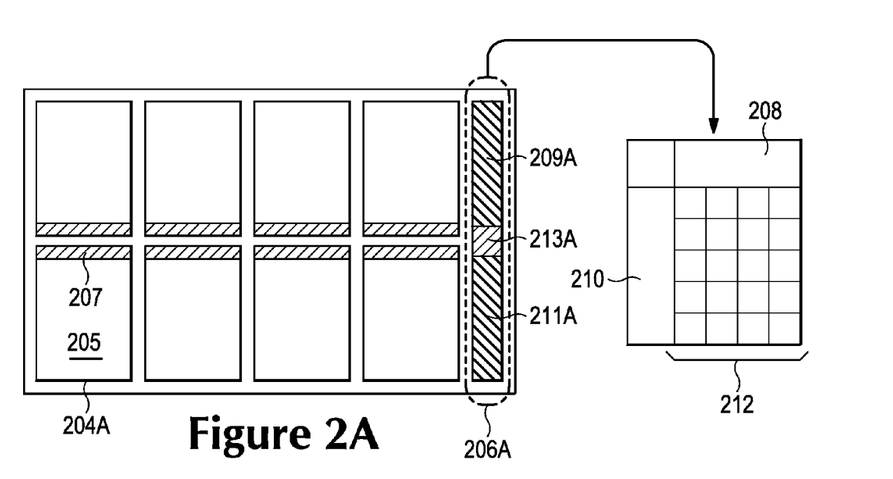
FIGS. 2A to 2G are illustrations of circuit arrangements in a semiconductor layer in a stacked memory device according to various embodiments.
Figure 2B:
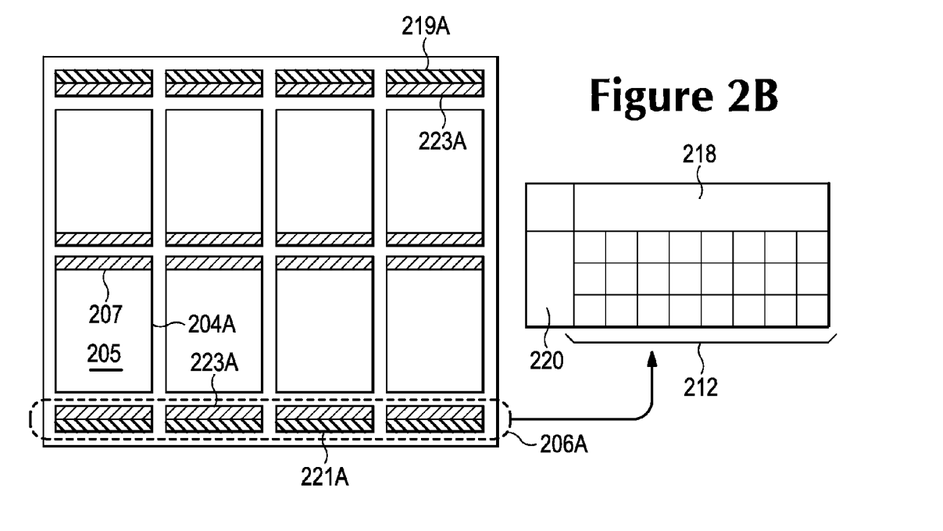

In an embodiment shown in FIG. 2B, redundant memory circuit 206A is organized row-wise (each partial memory bank contains a number of columns corresponding to the memory circuit that will be replaced, but less rows) and arranged above or below (assuming bank rows are horizontal in the figure) memory circuits 204A. Redundant resources circuit 206A includes partial memory banks 219A and 221A and is associated with an I/O field 223A. Each partial memory bank 219A or 221A includes an array of memory cells 212 with a partial row decoder 220 and a full column decoder 218. If memory bank 205 includes R addressable rows by C addressable columns, each partial memory bank 219A or 221A may include $R/2^N$ addressable rows and C addressable columns (plus optional spare columns and/or rows for column and/or row repair to replace defective addressable columns and/or rows), where N is an integer. A decoder, e.g., logic 350, selects a correct one of the redundant resources circuits 206A arranged on one of the circuit layers for the row address, based on the portion of the row address not decoded by the partial column decoder 208.

Figure 2C:
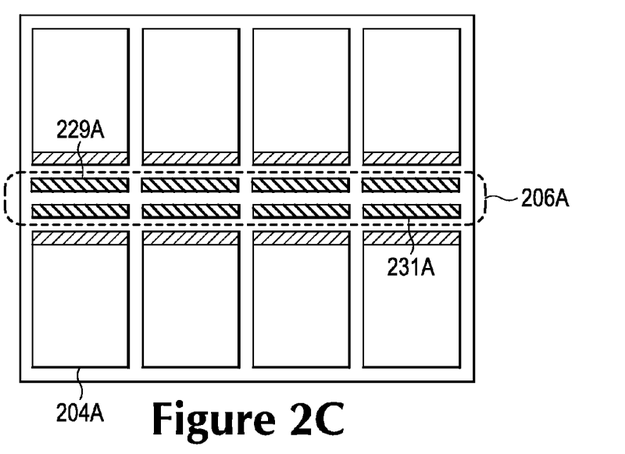
Figures 2D, 2E, 2F:
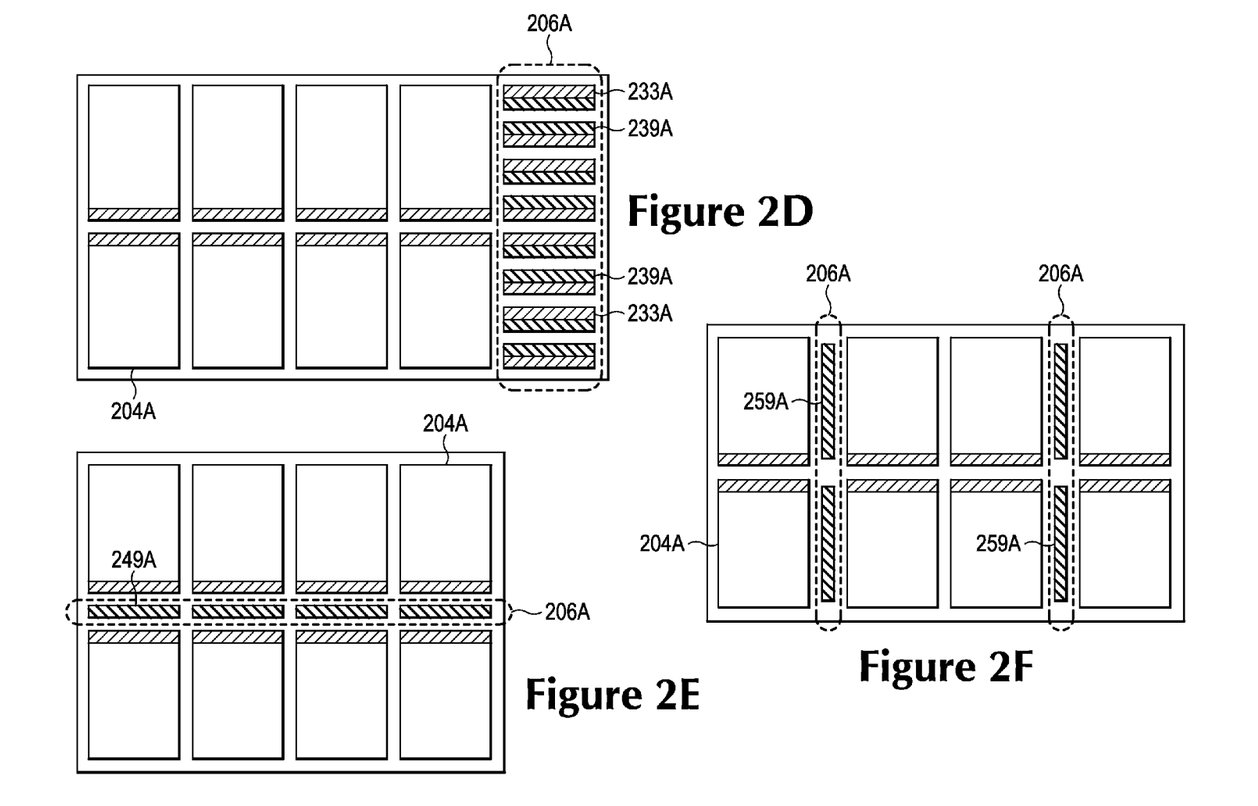
Figure 2G:
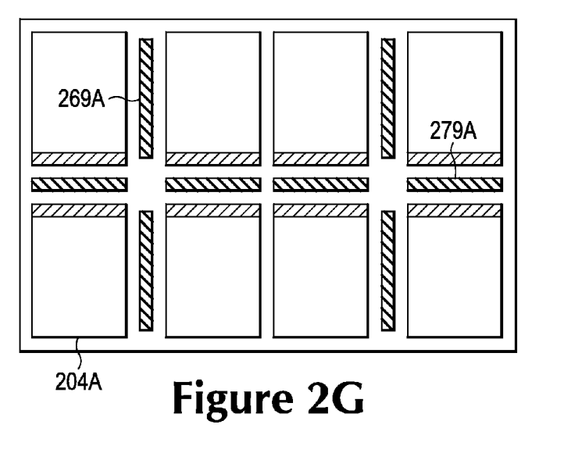

In an embodiment shown in FIG. 2C, a redundant resources circuit 206A includes two groups of full column-width partial memory banks (memory banks 229A and 231A are labeled) arranged horizontally between upper and lower groups of memory circuits 204A. In an embodiment shown in FIG. 2D, a redundant resources circuit 206A includes multiple partial memory banks (some labeled as 239A) and associated I/O fields 233A organized row-wise and arranged at an end of memory circuits 204A. In an embodiment shown in FIG. 2E, a redundant resources circuit 206A includes a group of column-width partial memory banks (249A is labeled) arranged horizontally across the device between rows of memory circuits 204A. In an embodiment shown in FIG. 2F, a redundant resources circuit 206A includes multiple groups of row-width partial memory banks 259A arranged vertically and interspersed horizontally between memory circuits 204A. In an embodiment shown in FIG. 2G, a redundant resources circuit 206A includes both column-width partial memory banks 279A arranged horizontally across the device between rows of memory circuits 204A and row-width partial memory banks 269A arranged vertically and interspersed horizontally between memory circuits 204A. Other arrangements of redundant resources circuits 206A are possible, including further combinations of the arrangements shown in FIGS. 2A-2G.

Figure 3A:
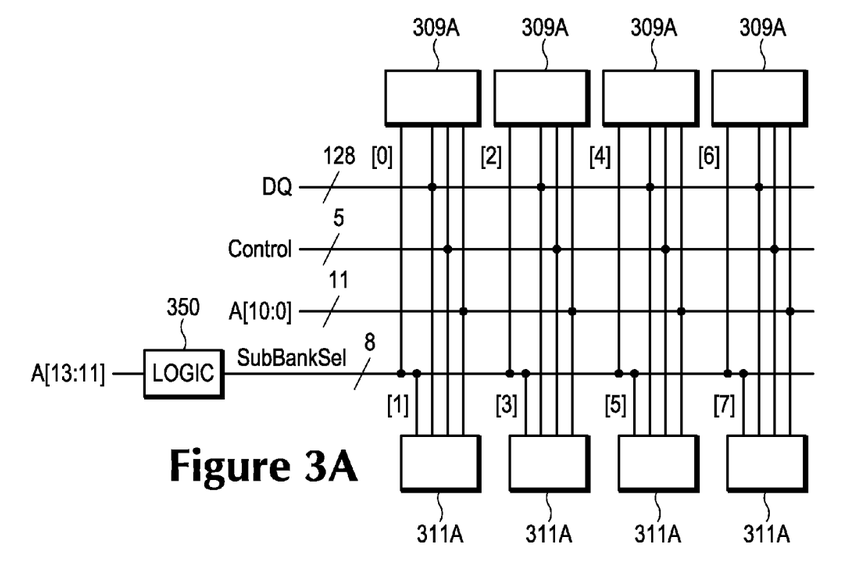
FIGS. 3A to 3C are illustrations of interface circuits used to replace defective circuitry in a stacked memory device according to various embodiments.
Figures 3B, 3C:
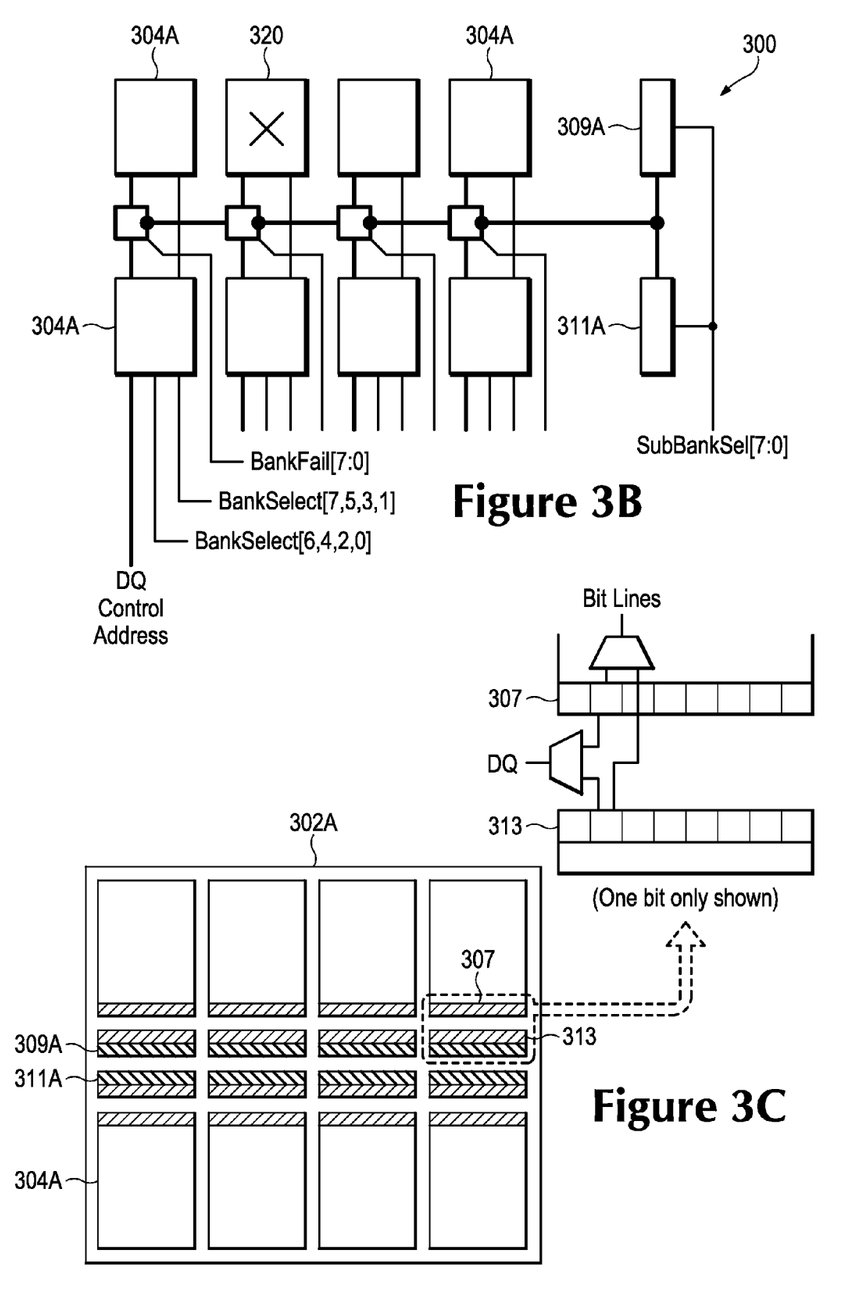

FIGS. 3A to 3C contain illustrations of interface circuits used to replace defective circuitry in a stacked memory device according to various embodiments. Referring to FIG. 3A, each partial memory bank 309A and 311A couples to an interface comprising DQ lines, control lines, and low order address lines A[10:0]. A logic circuit 350 decodes high order address lines A[13:11] to generate a signal on one of a group of select lines SubBankSel[0:7], each coupled respectively to a corresponding partial memory bank 309A or 311A. Appropriate activation of the control lines, address lines, and logic 350 allows replacement of defective circuitry, e.g., defective memory banks, in response to enabling the appropriate select line, e.g., SubBankSel[i], corresponding to a configured partial memory bank 309A or 311A.

Referring to FIG. 3B, stacked memory device 300 includes memory circuits 304A and partial memory banks 309A and 311A. Memory circuits 304A and partial memory banks 309A, 311A commonly share an interface channel that includes DQ lines, address lines, and control lines. BankSelect lines [0:7] select the appropriate bank for each operation, and SubBankSel lines [0:7] select the appropriate subbank or subbanks for an operation directed to a replaced bank (in which case the corresponding BankSelect line, e.g., the one for defective bank 320, is not enabled). In response to an enabled BankFail line, defective memory circuit 320 is disconnected from the interface channel to be replaced on the channel by partial spare banks 309A or 311A, or both and potentially other partial spare banks on other memory circuits in the stack.

Referring to FIG. 3C, two rows of column-width partial memory banks 309A and 311A are arranged between rows of memory circuits 304A. Each of partial memory banks 309A and 311A have a corresponding I/O field 313 that can be configured to replace, by itself, an I/O field 307 corresponding to the memory circuit 304A since I/O field 313 has a complete set of column circuitry. If a column circuit (e.g., decoder, amplifier, or selector) fails in the memory circuit 304A, the failed I/O field 307 can be replaced by I/O field 313 in a neighboring partial memory bank 309A or 311A (without using the partial memory bank itself). The embodiment of FIG. 3C refers to bit lines, but more generally the multiplexer selecting between circuit 307 and circuit 313 could also be connected to a data line internally to the memory bank that is connected to a bitline through further internal multiplexers. An example for such a data line would be a global array data line as typically used in a DRAM with hierarchical data line architecture. A similar structure can be used for the high level row circuitry.

Figure 4A:
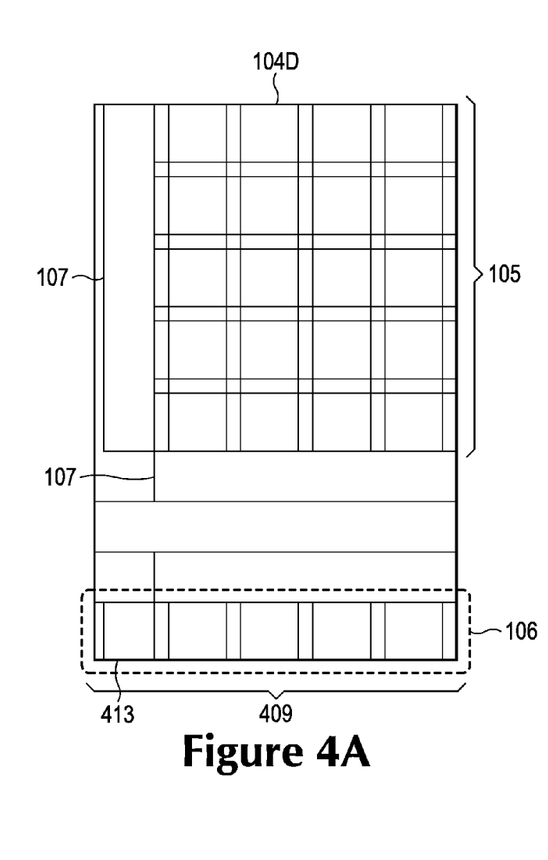
FIGS. 4A to 4C are illustrations of a memory bank in a stacked memory device according to various embodiments.
Figure 4B:
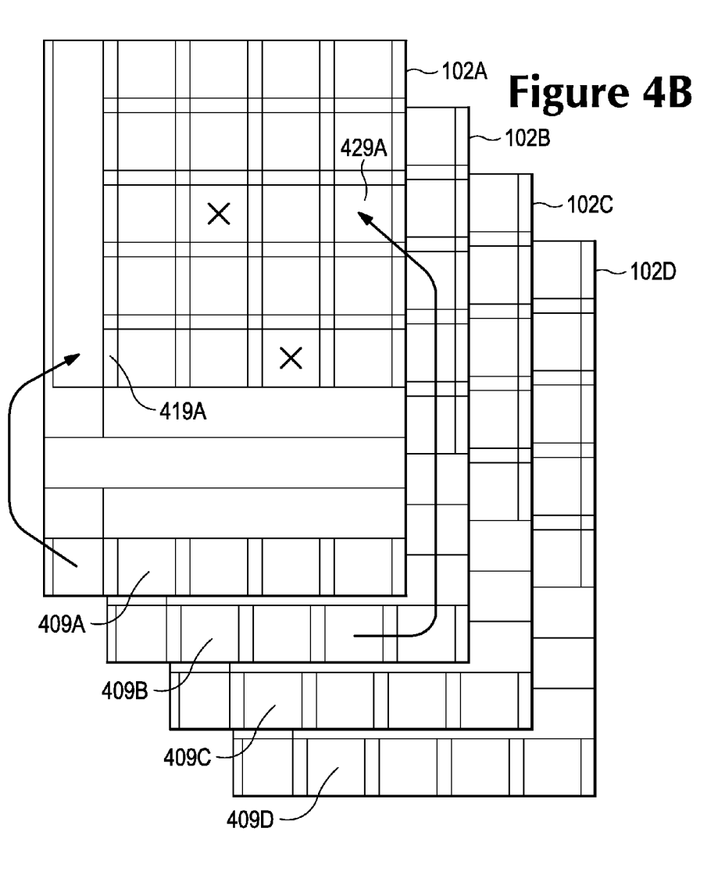
Figure 4C:
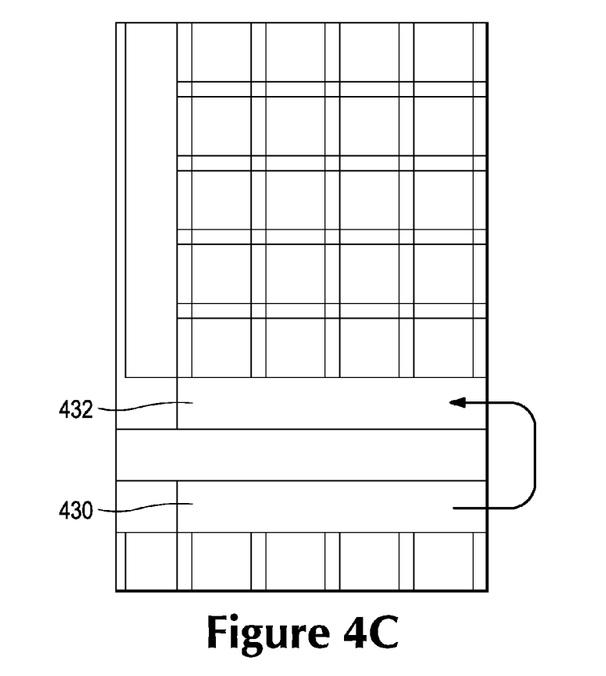

FIGS. 4A to 4C contain illustrations of a memory bank in a stacked memory device according to various embodiments. Referring to FIGS. 4A to 4C, an exemplary memory circuit 104D includes memory bank 105 and I/O field 107. Redundant resources circuit 106 includes a partial array of memory cells 409 configured to replace defective memory cells on any semiconductor layer 102A, 102B, 102C, or 102D. An exemplary memory bank 105 includes R rows by C columns and a partial array of memory cells 409 may include a single row of C cells formed above or below, at a plan view, of memory bank 105. I/O field 413 may include row and column decoder circuitry 432 (FIG. 4C) configured to address the array 409. In an exemplary embodiment shown in FIG. 4B, partial array of memory cells 409A arranged on layer 102A replaces a defective row of memory cells 419A also arranged on layer 102A. In another exemplary embodiment shown in FIG. 4B, partial array of memory cells 409B, arranged on layer 102B may replace a defective row of memory cells 429A arranged on layer 102A. In yet another exemplary embodiment shown in FIG. 4C, column logic 430 may replace defective column logic 432 formed on any semiconductor circuit layer in the stack.

Figure 5:
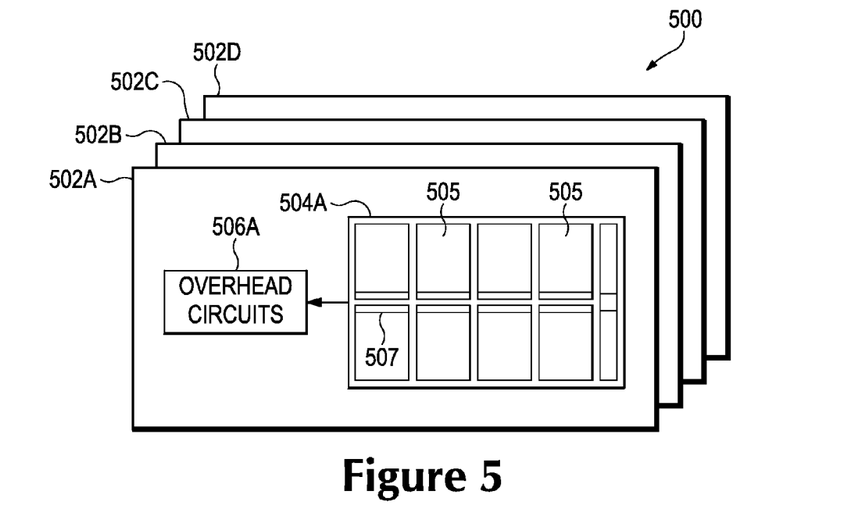
FIG. 5 is an illustration of a stacked memory device according to various embodiments.

FIG. 5 is an illustration of a stacked memory device according to various embodiments. Referring to FIG. 5, a stacked memory device 500 includes semiconductor circuit layers 502A, 502B, 502C, and 502D, each of which has integrated circuits formed thereon. For example, layer 502A may include a memory circuit 504A and an overhead circuit 506A. Similarly, layer 502D may include a memory circuit 504D and an overhead circuit 506D (not visible). Semiconductor circuit layers 502A, 502B, 502C, and 502D are stacked, aligned, and bonded one layer on top of another layer, e.g., using well-known semiconductor manufacturing processes. FIG. 5 shows stacked memory device 500 as including four semiconductor circuit layers 502A, 502B, 502C, and 502D but stacked memory device 500 may include any plurality of semiconductor circuit layers.

Each of semiconductor circuit layers 502A, 502B, 502C, or 502D may include a memory circuit 504A, 504B, 504C, and 504D and a corresponding overhead circuit 506A, 506B, 506C, and 506D. Each memory circuit 504A, 504B, 504C, or 504D, in turn, may include a plurality of memory banks 505 and corresponding input/output fields 507.

Overhead circuits 506A, 506B, 506C, and 506D may include control and address logic, pipelines, charge pumps, row logic, column logic, and the like that are configured to control the memory circuits 504A, 504B, 504C, and 504D. Overhead circuits 506A, 506B, 506C, and 506D may be fully or partially replicated on each of semiconductor circuit layers 502A, 502B, 502C, and 502D. Fully replicating overhead circuits 506A, 506B, 506C, or 506D on each semiconductor circuit layer 502A, 502B, 502C, and 502D may allow for a memory device formed on a single semiconductor layer, e.g., device 504A formed on layer 502A, to be fully functional independent of being included in stacked memory device 500. Partially replicating overhead circuits 506A, 506B, 506C, or 506D on semiconductor circuit layers 502A, 502B, 502C, and 502D may decrease integrated circuit costs relative to full replication of overhead circuits but would not provide for a fully functional memory device on a single semiconductor layer. In one embodiment, overhead circuits 506A and 506C may handle high order bits while overhead circuits 506B and 506D may handle low order bits. Full or partial replication of overhead circuits may allow the replacement of defective overhead circuits identified on any of the semiconductor circuit layers 502A, 502B, 502C, or 502D.

Figure 6A:
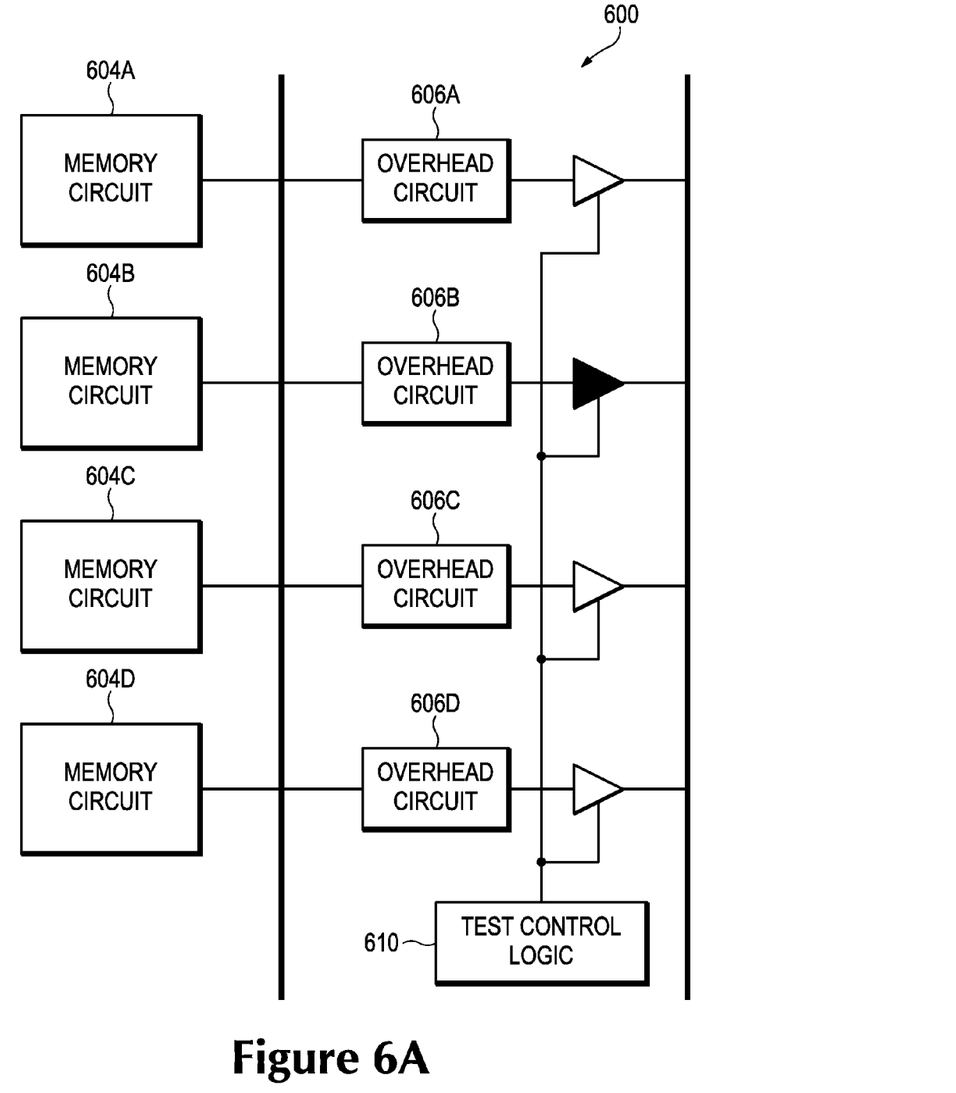
FIG. 6A is an illustration of a stacked memory device having a fully replicated overhead circuit on each of the semiconductor layers according to an embodiment.

FIG. 6A is an illustration of a stacked memory device 600 having a fully replicated overhead circuit on each of the semiconductor layers according to an embodiment. Referring to FIG. 6A, test and control logic 610 is configured to test overhead circuits 606A, 606B, 606C, and 606D to identify overhead circuits that include defective circuitry and to select at least one of the overhead circuits 606A, 606B, 606C, and 606D to service the memory circuits 604A, 604B, 604C, and 604D in the stacked memory device 600.

Figure 6B:
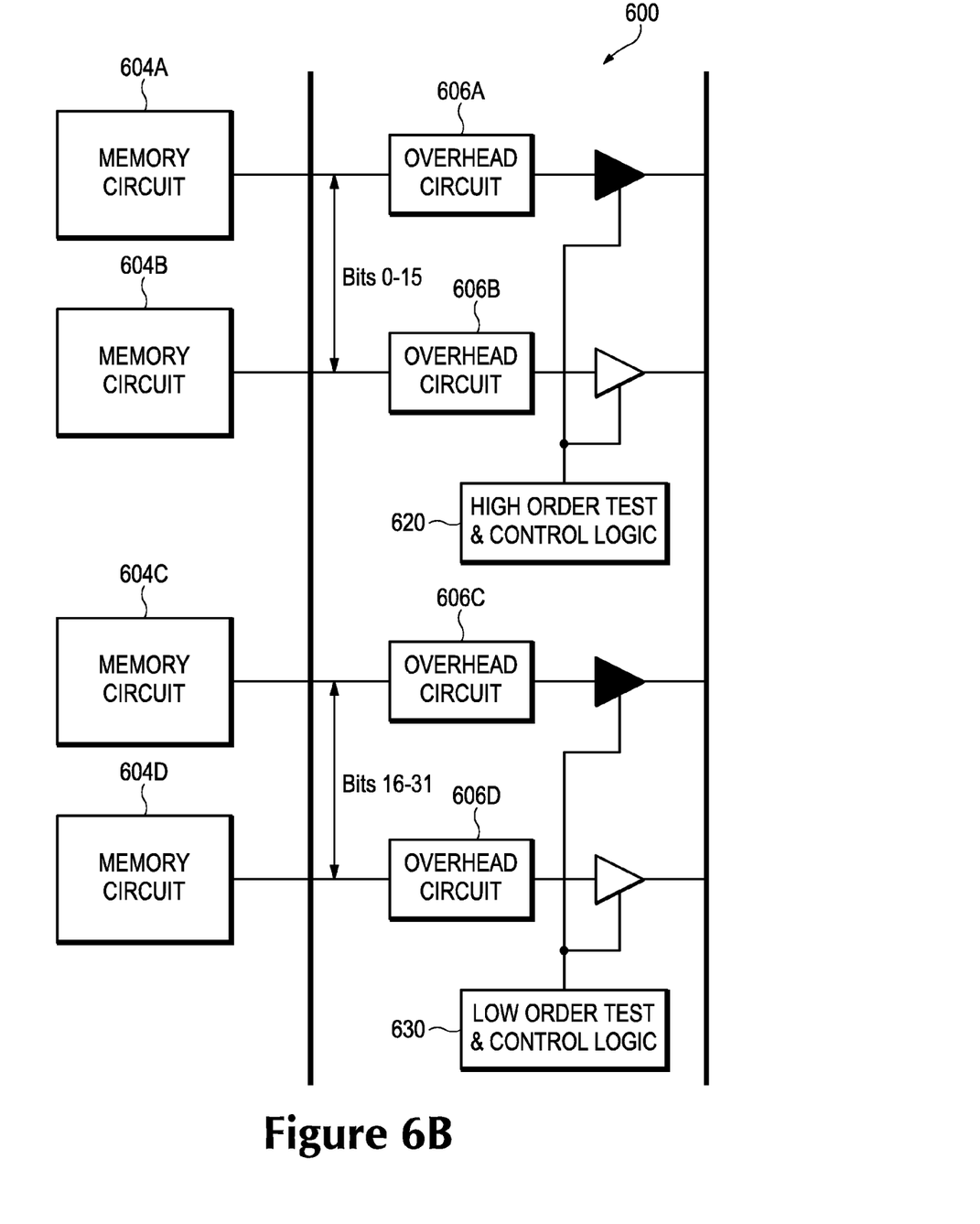
FIG. 6B is an illustration of a stacked memory device having a partially replicated overhead circuit on each of the semiconductor layers according to an embodiment.

FIG. 6B is an illustration of a stacked memory device having a partially replicated overhead circuit on each of the semiconductor layers according to an embodiment. Referring to FIG. 6B, high order bits test control circuit 620 is configured to test high order bits overhead circuits 606A and 606C to identify overhead circuits that include defective circuitry and to select at least one of the overhead circuits 606A or 606C to service the high order bits of memory circuits 604A, 604B, 604C, and 604D in stacked memory device 600. Similarly, low order bits test and control logic circuit 630 is configured to test low order bits overhead circuits 606B and 606D to identify overhead circuits that include defective circuitry and to select at least one of the overhead circuits 606B or 606D to service the low order bits of memory circuits 604A, 604B, 604C, and 604D in stacked memory device 600.

A person of ordinary skill in the art will recognize that they may make many changes to the details of the above-described stacked memory device without departing from the underlying principles. Only the following claims, however, define the scope of the stacked memory device.

The invention claimed is:

1. A device, comprising:
    a stack of circuit layers, each circuit layer having formed thereon:
        a memory circuit configured to store data; and
        a redundant resources circuit configured to provide redundant circuitry to replace defective circuitry on at least one memory circuit arranged on at least one layer in the stack;
    wherein the at least one layer can be a layer other than the layer having formed thereon the redundant resources circuit;
    wherein the memory circuit comprises at least one bank of memory cells;
    wherein the redundant resources circuit comprises a partial bank of redundant memory cells;
    wherein an aggregation of the partial bank of redundant memory cells in a plurality of the circuit layers of the stack comprises at least one full bank of redundant memory cells; and
    wherein the at least one full bank of redundant memory cells is configured to replace at least one bank of memory cells arranged on any of the circuit layers in the stack.

2. The device of claim 1, wherein the partial bank of redundant memory cells comprises a size that is 1/64, 1/32, 1/16, 1/8, 1/4, or 1/2 of a size of the at least one bank of memory cells.

3. The device of claim 1, wherein the redundant resources circuit further comprises an input/output circuit arranged vertically through the stack of circuit layers and configured to provide input or output signals to the at least one full bank of redundant memory cells.

4. The device of claim 1,
    wherein the least one bank of memory cells comprises an array of memory cells arranged in a number of columns and a number of rows;
    wherein the partial bank of redundant memory cells is arranged in a fraction of the number of columns and the number of rows in the array of memory cells; and
    wherein the redundant resources circuit further comprises:
        a full row decoder configured to decode a row address for the partial bank of redundant memory cells; and
        a partial column decoder configured to decode a partial column address for the partial bank of redundant memory cells.

5. The device of claim 4, further comprising a circuit layer decoder to, based on a portion of a column address not decoded by the partial column decoder, select a correct one of the redundant resources circuits for the column address.

6. The device of claim 1,
    wherein the at least one bank of memory cells comprises an array of memory cells arranged in a number of columns and a number of rows;
    wherein the partial bank of memory cells is arranged in the number of columns and a fraction of the number of rows in the array of memory cells; and
    wherein the redundant resources circuit further comprises:
        a partial row decoder configured to decode a partial row address for the partial bank of redundant memory cells; and
        a full column decoder configured to decode a column address for the partial bank of redundant memory cells.

7. The device of claim 6, further comprising a circuit layer decoder to, based on the portion of the row address not decoded by the partial row decoder, select a correct one of the redundant resources circuit for the row address.

8. The device of claim 6, wherein the partial bank of redundant memory cells are arranged above or below, in a plan view, the array of memory cells.

9. The device of claim 6, wherein the partial bank of memory cells are arranged to one side, in a plan view, of the at least one bank of memory cells.

10. The device of claim 1, wherein the aggregation of the partial bank of redundant memory cells is configured to be separately addressable in the device.

11. The device of claim 1,
    wherein the memory circuit comprises an array of memory cells;
    wherein the redundant resources circuit comprises an array of redundant memory cells; and wherein the redundant resources circuit is configured to replace a defective memory cell formed on any of the circuit layers in the stack with a redundant memory cell.

12. The device of claim 11,
wherein the array of memory cells comprises M rows and N columns; and
wherein the array of redundant memory cells is arranged as a 1×N array.

13. The device of claim 11,
wherein the redundant resources circuit comprises a column of redundant memory cells; and
wherein the redundant resources circuit is configured to replace a defective column of memory cells formed on any of the circuit layers in the stack with the column of redundant memory cells.

14. The device of claim 11,
wherein the redundant resources circuit comprises a row of redundant memory cells; and
wherein the redundant resources circuit is configured to replace a defective row of memory cells formed on any of the circuit layers in the stack by aggregating the redundant memory cells formed on the circuit layers in the stack.

15. A device, comprising:
a stack of circuit layers, each circuit layer having formed thereon:
a memory circuit configured to store data; and
a redundant resources circuit configured to provide redundant circuitry to replace defective circuitry on at least one memory circuit arranged on at least one layer in the stack;
wherein the at least one layer can be a layer other than the layer having formed thereon the redundant resources circuit;
wherein the memory circuit comprises a plurality of memory cells; and
wherein the redundant resources circuit comprises an overhead circuit configured to control the plurality of memory cells.

16. The device of claim 15, further comprising a selection circuit configured to select at least one of the overhead circuits from at least one of the circuit layers to provide at least one data path to the plurality of memory cells in the circuit layers of the stack.

17. A device, comprising:
a stack of circuit layers, each circuit layer having formed thereon:
a memory circuit configured to store data; and
a redundant resources circuit configured to provide redundant circuitry to replace defective circuitry on at least one memory circuit arranged on at least one layer in the stack;
wherein the at least one layer can be a layer other than the layer having formed thereon the redundant resources circuit;
wherein the memory circuit comprises a plurality of memory cells;
wherein the redundant resources circuits corresponding to a first group of circuit layers in the stack comprises corresponding first overhead circuits coupled to high order bits of a first group of the plurality of memory cells in the first group of circuit layers; and
wherein the redundant resources circuits corresponding to a second group of circuit layers in the stack comprises corresponding second overhead circuits coupled to low order bits of a second group of the plurality of memory cells in the second group of circuit layers.

18. The device of claim 17, further comprising a selection circuit configured to:
select at least one of the first overhead circuits from at least one of the first group of circuit layers to provide at least one data path to the first group of the plurality of memory cells; and
select at least one of the second overhead circuits from at least one of the second group of circuit layers to provide at least one data path to the second group of the plurality of memory cells.

19. A method, comprising:
forming a memory circuit and a resources circuit on each of a plurality of circuit layers;
vertically arranging the plurality of circuit layers in a stack to thereby communicatively couple the memory circuits and the resources circuits formed on each of the plurality of circuit layers;
detecting a defective circuit on at least a portion of a memory circuit formed on one of the plurality of circuit layers; and
logically replacing the defective circuit with at least a portion of a resources circuit formed on any of the plurality of circuit layers other than the one of the plurality of circuit layers having formed thereon the defective circuit;
wherein forming the memory circuit and the resources circuit on each of the plurality of circuit layers further comprises:
forming at least one bank of memory cells on each of the plurality of circuit layers; and
forming a partial bank of redundant memory cells on each of the plurality of circuit layers;
wherein an aggregation of the partial bank of redundant memory cells formed on each of the plurality of circuit layers comprises at least one full bank of redundant memory cells; and
wherein logically replacing the defective circuit further comprises logically replacing the at least one bank of memory cells with the at least one full bank of redundant memory cells.

20. The method of claim 19, wherein forming the partial bank of redundant memory cells further comprises forming the partial bank of redundant memory cells to have a size that is 1/64, 1/32, 1/16, 1/8, 1/4, or 1/2 of a size of the at least one bank of memory cells.

21. The method of claim 19, further comprising forming an input/output circuit arranged vertically through the plurality of circuit layers and configured to provide input signals or output signals to the at least one full bank of redundant memory cells.

22. The method of claim 19,
wherein forming the at least one bank of memory cells further comprises arranging the at least one bank of memory cells in an array having a number of columns and a number of rows;
wherein forming the partial bank of redundant memory cells further comprises:
arranging the partial bank of redundant memory cells in a fraction of the number of columns and the number of rows in the array;
forming a full row decoder configured to decode a row address for the partial bank of redundant memory cells; and
forming a partial column decoder configured to decode a partial column address for the partial bank of redundant memory cells.

23. The method of claim 22, further comprising forming a circuit layer decoder configured to, based on a portion of a column address not decoded by the partial column decoder, select a correct one of the redundant resources circuits for the column address.

24. The method of claim 19,
wherein forming the at least one bank of memory cells further comprises arranging the at least one bank of memory cells in an array having a number of columns and a number of rows;
wherein forming the partial bank of redundant memory cells further comprises:
arranging the partial bank of redundant memory cells in the number of columns and at least one row;
forming a partial row decoder configured to decode a partial row address for the at least one row; and
forming a full column decoder configured to decode a column address for the partial bank of redundant memory cells.

25. The method of claim 24, further comprising forming a circuit layer decoder configured to, based on a portion of a row address not decoded by the partial row decoder, select a correct one of the redundant resources circuits for the row address.

26. The method of claim 24, further comprising arranging the partial bank of redundant memory cells above or below, in a plan view, the array of memory cells.

27. The method of claim 24, further comprising arranging the partial bank of redundant memory cells to one side, in a plan view, of the array of memory cells.

28. The method of claim 19, further comprising separately addressing the partial bank of redundant memory cells.

29. The method of claim 19,
wherein forming the memory circuit and the resources circuit on each of the plurality of circuit layers further comprises:
forming an array of memory cells on each of the plurality of circuit layers; and
forming an array of redundant memory cells on each of the plurality of circuit layers; and
wherein logically replacing the defective circuit further comprises logically replacing defective memory cells formed on any of the plurality of circuit layers with redundant memory cells formed on any of the plurality of circuit layers other than the layer having the defective memory cells formed thereon.

30. The method of claim 29,
wherein the array of memory cells comprises M rows and N columns; and
wherein the array of redundant memory cells comprises one row and N columns.

31. The method of claim 29,
wherein forming the array of redundant memory cells further comprises forming a column of redundant memory cells on at least one circuit layer; and
wherein logically replacing the defective circuit further comprises logically replacing a defective column of memory cells formed on a circuit layer other than the at least one circuit layer with the column of redundant memory cells formed on the at least one circuit layer.

32. The method of claim 29,
wherein forming the array of redundant memory cells further comprises forming a row of redundant memory cells on at least one circuit layer; and
wherein logically replacing the defective circuit further comprises logically replacing a defective row of memory cells formed on a circuit layer other than the at least one circuit layer with the row of redundant memory cells formed on the at least one circuit layer.

33. A method, comprising:
forming a memory circuit and a resources circuit on each of a plurality of circuit layers;
vertically arranging the plurality of circuit layers in a stack to thereby communicatively couple the memory circuits and the resources circuits formed on each of the plurality of circuit layers;
detecting a defective circuit on at least a portion of a memory circuit formed on one of the plurality of circuit layers; and
logically replacing the defective circuit with at least a portion of a resources circuit formed on any of the plurality of circuit layers other than the one of the plurality of circuit layers having formed thereon the defective circuit;
wherein forming the memory circuit and the resources circuit on each of the plurality of circuit layers further comprises:
forming a plurality of memory cells on each of the plurality of circuit layers; and
forming an overhead circuit configured to control the plurality of memory cells on each of the plurality of circuit layers.

34. The method of claim 33, further comprising selecting at least one of the overhead circuits formed on at least one of the plurality of circuit layers to provide at least one data path to the plurality of memory cells formed in the plurality of circuit layers.

35. The method of claim 33, wherein forming the memory circuit and the resources circuit on each of the plurality of circuit layers further comprises:
forming a plurality of memory cells on each of the plurality of circuit layers;
forming first overhead circuits on a first group of the plurality of circuit layers configured to control high order bits of a first group of the plurality of memory cells formed on the first group of the plurality of circuit layers; and
forming second overhead circuits on a second group of the plurality of circuit layers configured to control low order bits of a second group of the plurality of memory cells formed on the second group of the plurality of circuit layers.

36. The method of claim 35, further comprising:
selecting at least one of the first overhead circuits from at least one of the first group of circuit layers to provide at least one data path to the first group of the plurality of memory cells; and
selecting at least one of the second overhead circuits from at least one of the second group of circuit layers to provide at least one data path to the second group of the plurality of memory cells.

37. A memory system, comprising:
a stack of integrated circuit layers, each integrated circuit layer having arranged thereon:
a memory circuit comprising a bank of memory cells; and
a resource circuit configured to replace a defective circuit in the memory circuit and comprising a partial bank of redundant memory cells;
wherein the defective circuit is arranged on any circuit layer in the stack of circuit layers including a circuit layer other than the circuit layer having the resource circuit arranged thereon;

wherein the resource circuit is configured to replace at least a portion of the bank of memory cells with a portion of the partial bank of redundant memory cells in response to determining defective the at least a portion of the bank of memory cells; and wherein an aggregation of the partial banks of redundant memory cells arranged on the stack of integrated circuit layers comprises at least one full bank of redundant memory cells.

38. The memory system of claim 37, wherein the aggregation of the partial banks of redundant memory cells is configured to be separately addressable from the memory circuit.

39. The memory system of claim 37, wherein the partial bank of redundant memory cells comprises a size that is 1/64, 1/32, 1/16, 1/8, 1/4, or 1/2 of a size of the bank of memory cells.

40. The memory system of claim 37,
wherein the partial bank of redundant memory cells is arranged in a column and at least one row; and
wherein the resource circuit further comprises:
a full row decoder configured to decode a row address for the partial bank of redundant memory cells; and
a partial column decoder circuit configured to decode a partial column address the partial bank of redundant memory cells.

41. The memory system of claim 40, further comprising a circuit layer decoder to, based on a portion of a column address not decoded by the partial column decoder, select a correct one of the resources circuits.

42. The memory system of claim 37,
wherein the partial bank of redundant memory cells is arranged in at least one column and a row; and
wherein the resource circuit further comprises:
a partial row decoder configured to decode a partial row address for the partial bank of redundant memory cells; and
a full column decoder circuit configured to decode a column address for the partial bank of redundant memory cells.

43. The memory system of claim 42, further comprising a circuit layer decoder to, based on a portion of a row address not decoded by the partial row decoder, select a correct one of the resources circuit.

44. The memory system of claim 37,
wherein the memory circuit comprises a plurality of memory cells;
wherein the resource circuit comprises a plurality of redundant memory cells; and
wherein the resource circuit is configured to replace at least a portion of the plurality of memory cells formed on any of the integrated circuit layers with a corresponding portion of the plurality of redundant memory cells formed on at least one of the integrated circuit layers in response to determining defective the at least a portion of the plurality of memory cells.

45. The memory system of claim 44,
wherein the resource circuit is configured to replace a defective column of memory cells with a column of redundant memory cells arranged on a layer other than a layer having the defective column of memory cells arranged thereon.

46. The memory system of claim 44,
wherein the resource circuit is configured to replace a defective row of memory cells by aggregating rows of redundant memory cells arranged on the integrated circuit layers in the stack.

47. The memory system of claim 37,
wherein the memory circuit comprises a plurality of memory cells; and
wherein the resource circuit comprises a control circuit configured to control the plurality of memory cells.

48. The memory system of claim 47, further comprising a selection circuit configured to select at least one of the control circuits arranged on at least one of the integrated circuit layers to provide at least one data path to the plurality of memory cells.

* * * * *